United States Patent [19]

O'Neill et al.

[11] Patent Number: 5,770,097
[45] Date of Patent: Jun. 23, 1998

[54] CONTROL OF ETCH SELECTIVITY

[75] Inventors: James Anthony O'Neill, New City; Jyothi Singh, Hopewell Junction, both of N.Y.

[73] Assignee: International Business Machines Corporation, Armonk, N.Y.

[21] Appl. No.: 873,055

[22] Filed: Jun. 11, 1997

Related U.S. Application Data

[62] Division of Ser. No. 363,674, Dec. 23, 1994, Pat. No. 5,683,538.

[51] Int. Cl.[6] .................................................. H01L 21/302
[52] U.S. Cl. .............................. 216/60; 216/59; 216/67; 216/68; 438/714; 438/719; 438/723
[58] Field of Search ................................ 216/59, 60, 67, 216/68; 438/714, 719, 723

[56] References Cited

U.S. PATENT DOCUMENTS

| | | | |
|---|---|---|---|
| 4,393,311 | 7/1983 | Feldman et al. | 250/459.1 |
| 4,394,237 | 7/1983 | Donnelly et al. | 204/192 E |
| 4,417,822 | 11/1983 | Stein et al. | 374/129 |
| 4,500,563 | 2/1985 | Ellenberger et al. | 427/38 |
| 4,647,774 | 3/1987 | Brisk et al. | 250/338 |
| 4,859,277 | 8/1989 | Barna et al. | 156/626 |
| 4,883,560 | 11/1989 | Ishihara | 156/626 |
| 4,919,542 | 4/1990 | Nulman et al. | 374/9 |
| 4,956,538 | 9/1990 | Moslehi | 219/121.6 |
| 4,979,134 | 12/1990 | Arima et al. | 354/557 |
| 4,984,902 | 1/1991 | Crowley et al. | 374/1 |
| 5,014,217 | 5/1991 | Savage | 164/498 |
| 5,098,197 | 3/1992 | Shepard et al. | 374/120 |
| 5,154,512 | 10/1992 | Schietinger et al. | 374/9 |
| 5,156,461 | 10/1992 | Moslehi et al. | 374/121 |
| 5,226,732 | 7/1993 | Nakos et al. | 374/133 |
| 5,326,171 | 7/1994 | Thompson et al. | 374/121 |
| 5,387,777 | 2/1995 | Bennett et al. | 219/121.43 |

FOREIGN PATENT DOCUMENTS

| | | |
|---|---|---|
| 4012615 | 7/1992 | Germany . |
| 60-13143 | 7/1985 | Japan . |
| 60-253939 | 12/1985 | Japan . |

OTHER PUBLICATIONS

"Rapid Thermal and Integrated Processing", J. Gelpey et al., Materials Research Society Symposium Proceedings, vol. 224, Apr. 30–May 3, 1991, p. 13.

"Manufacturing Equipment Issues in Rapid Thermal Processing", F. Roozeboom, Rapid Thermal Processing Science and Technology, 1993, Month of Publication Not Available pp. 380–381.

*Primary Examiner*—Kathryn L. Gorgos
*Assistant Examiner*—William T. Leader
*Attorney, Agent, or Firm*—Perman & Green, LLP

[57] ABSTRACT

Selective etching of separate materials in a manufacture of a device, such as a layer of silicon dioxide on a substrate of silicon in a semiconductor device, is accomplished in a reaction chamber having an RF electromagnetic field which interacts with plural etchants in gaseous phase to produce ions for etching the materials. The ratio of the concentration of etchants affect the relative rates of etching the respective materials. By pulsing the rf excitation waveform, intervals of deenergization of the field are produced repetitively wherein, during any one of these intervals, there is a decay in the concentration of each ionized etchant. Rates of decay and the resulting lifetimes differ for each of the etchants. Thereby, by adjustment of the duration of the deenergization interval, the average concentration of one etchant relative to the average concentration of a second etchant can be varied to attain selective etching of the materials. Continuous monitoring of etchant concentrations, as by ultraviolet absorption spectroscopy, permits automatic control of the modulation to attain a desired etch selectivity in real time.

5 Claims, 9 Drawing Sheets

CONTROL OF ETCH SELECTIVITY

This is a divisional of application Ser. No. 08/363,674 filed on Dec. 23, 1994, now U.S. Pat. No. 5,683,538.

BACKGROUND OF THE INVENTION

This invention relates to etching of components in a manufacturing process and, more particularly, to the etching of parts of a semiconductor device in polymer forming discharges containing halocarbon species, wherein an ionizing RF (radio frequency) electromagnetic field is activated to produce a plasma of ions and neutral fragments such as CF and $CF_2$ for selective etching of materials such as silicon dioxide relative to polysilicon where the ratio of concentrations of these species to each other or to atomic fluorine controls the etch selectivity and wherein this ratio is adjusted by pulsing the electromagnetic field which sustains the plasma. The duration and duty cycle of the pulsing waveform is controlled by a signal derived from optical measurements of the concentration of these species in the reactor.

Etching is widely used in the fabrication of semiconductor devices for electronic circuits. An important example of such fabrication is the patterning of a layer of silicon dioxide on a layer of silicon wherein specific thicknesses and geometric shapes are provided to the dielectric layer by the use of etchants. Of particular interest herein is the use of polymer forming etchants, such as fluorocarbons, wherein radicals of the form CF, $CF_2$ and $CF_3$ may be ionized by an RF electromagnetic field in a reactor to provide a plasma for etching the foregoing materials. It is known that the rate of silicon dioxide films relative to silicon varies in accordance with which of the foregoing radicals is present. In particular, it is noted that plasmas having a relatively low ratio of fluorine to carbon readily form polymers which retard the etching of silicon relative to silicon dioxide. In contrast, plasmas with a relatively high ratio of fluorine to carbon etch the silicon at significantly higher rate than an etching of the silicon dioxide. For example, this has been discussed in an article by J. W. Coburn and E. Kay, IBM J. Res. Develop. 23, 33 (1979).

In the manufacture of semiconductor devices, as well as other types of devices wherein etching is to be employed, it is advantageous to control the feature of selectivity of etch. This facilitates manufacture of a device by providing selective removal of various amounts of material in various layers of the device so as to obtain desired thicknesses and shapes for various parts of the device. Control of etch selectivity has been accomplished in the past by addition of hydrogen or oxygen to the plasma discharge, this being effective to alter the ratio of fluorine to carbon to control the etch selectivity through reactions which consume either carbon or fluorine. In this manner, most previous approaches to achieving etch selectivity have been accomplished by varying the gas phase chemistry through adjustments in the gases which are added to the reactor.

To determine whether a desired etch selectivity has been attained, post processing measurements are employed using test pieces or wafers. After correction to the selectivity by adjustments in the gases which are added to the reactor etching of the product pieces is initiated. Direct observation of the foregoing radicals in a plasma environment can be accomplished by optical emission spectroscopy (OES), laser induced fluorescence (LIF), and diode laser absorption spectroscopy (DLAS). For example, LIF is discussed in an article by P. J. Hargis, Jr., R. W. Light and J. M. Gee, in Laser Processing and Diagnostics, ed., D. Bauerle (Springer-Verlag, Berlin, 1984). These radicals and other radicals, as well as other atomic and molecular species, may be detected also by ultraviolet absorption spectroscopy. By way of example, ultraviolet absorption spectroscopy has been employed in a CVD (chemical vapor deposition) environment as disclosed in Zuhoski, U.S. Pat. 5,032,435.

A problem arises in that conventional manufacturing equipment used for selective etching processes fail to provide for in situ and real time determination of etch selectivity, and fail also to provide for real time adjustment of the etch selectivity upon a determination that such adjustment is necessary. This is disadvantageous in terms of precision of control of the parameters of the manufactured device, and in terms of requiring excessive time and cost for the manufacture.

SUMMARY OF THE INVENTION

The aforementioned problems are overcome and other advantages are provided by a system and method which, in accordance with the invention, provide for in situ and real time determination of etch selectivity, and provide furthermore for real time control of the etch selectivity to attain and to maintain a desired selectivity of etch. The operation of the invention is based on the observation that various radicals in a plasma environment, such as the foregoing radicals CF, $CF_2$ and $CF_3$, have different lifetimes. Differences in decay rates of the various radicals are due primarily to their relative reactivities with other species and their relative coefficients of sticking to the surface of a reactor. In the case of a reactor employing inductive or capacitive activation of the RF electromagnetic field, the lifetimes may be determined by OES upon extinction of the RF plasma. In particular, it has been observed that CF decays much more rapidly than $CF_2$.

Therefore, a ratio of the concentrations of the CF to the $CF_2$ would have a maximum value at the moment of deenergization of the electromagnetic field, and would then continue to drop during the decays of these two radicals.

In accordance with the invention, the RF electromagnetic field which excites the plasma is energized by a pulsed excitation waveform wherein a repetitive sequence of intervals of energization of the field are interspersed with intervals of deenergization of the field. During each interval of energization, there is a production of plasma having ions as well as the CF and the $CF_2$ radicals. During each interval of deenergization, there is a decay in the concentration of the CF radical and a decay in the concentration of the $CF_2$ radical with a continuous variation in the relative concentrations of the two radicals. The average value of the ratio of the concentrations of the two radicals is dependent on the pulse width and duty cycle of the waveform used to control the plasma excitation.

Moreover, as described above, the relative rates of etching of materials such as silicon dioxide and silicon are dependent primarily on the relative concentrations of CF and $CF_2$. The selectivity of the etching process provides for a more rapid etching of the silicon dioxide relative to the silicon when the average value of the concentration ratio $CF/CF_2$ is relatively low, and provides for a reduced etching of the silicon dioxide relative to the silicon when the average value of the concentration ratio $CF/CF_2$ is relatively high. It should be understood that other species present in the reactor such as fluorine atoms as well as ions also participate in the selective etching reaction and that the ratio of $CF/CF_2$ does not control the selective etch process but rather reflects the progress of the etching reaction.

Therefore, in accordance with the invention, the length of each of the deenergization intervals is adjusted to provide a desired selectivity to the etch. In general, adjustment of the deenergization interval provides for adjustment of the average concentration of the short-lived species (CF) relative to the average concentration of the long-lived species ($CF_2$) in the plasma.

A relatively low duty cycle, wherein the deenergization intervals are relatively long, results in a slower etch of both the silicon dioxide and the silicon due the significant reduction in the concentration of both of the etchants, this requiring additional time to complete the etching process. The opposite situation arises in the case of a high duty cycle because the concentrations of the two etchants are higher, and less time is required to complete the etching process. However, irrespective of the amount of time required to complete the etching process, the invention provides control over the etch selectivity.

The lifetimes of species such as F, CF and $CF_2$ have been measured. The lifetime of $CF_2$ is five times that of CF as reported by J. P. Booth, G. Hancock, N. D. Perry and M. J. Toogood, J Appl. Phys. 66, 5251 (1989). The measurement of CF lifetime by use of DLAS is reported by M. Magane, N. Itabashi, N. Nishiwaki, T. Goto, C. Yamada and E. Hirota, Jpn. J. Appl. Phys. 29, 1.829 (1990). The use of modulation of the RF field is advantageous for reduction of dust as reported by Y. Watanabe, M. Shiritani, Y. Kubo, I. Ogawa and S. Ogi, Appl. Phys. Lett. 53, 1263 (1988). The use of modulation of the RF field also effects plasma chemistry as reported by J. T. Verdeyen, J. Beberman and L. Overzet, J. Vac. Sci. Technol. A 8, 1851 (1990). Plasma modulation also provides the advantage of a reduction in the detrimental effects of particle formation in plasma etch environments as reported by G. Selwyn, et. al., IBM Research Reports 933A005345, 93A005124.

The invention provides for automatic control of the duty cycle of the plasma modulation by inclusion of detection apparatus to detect the presence of the various species such as the CF and the $CF_2$ in the reactor. The detection apparatus employs optical techniques such as ultraviolet absorption spectroscopy or optical emission spectroscopy, by way of example. Alternatively, the detection apparatus is operative to determine the relative amounts of $CF_2$ and atomic fluorine from OES actinometry. With either embodiment of the detection apparatus, prior knowledge of the relationship between etch rates and species concentrations in the plasma is stored, as in a read-only memory. The memory is addressed by the detection apparatus to output a command signal to pulse modulation circuitry to establish the requisite duty cycle to the modulated plasma for obtaining the desired etch selectivity.

BRIEF DESCRIPTION OF THE DRAWING

The aforementioned aspects and other features of the invention are explained in the following description, taken in connection with the accompanying drawing figures wherein.

Identically labeled elements appearing in different ones of the figures refer to the same element in the different figures.

DETAILED DESCRIPTION

Figure 1:
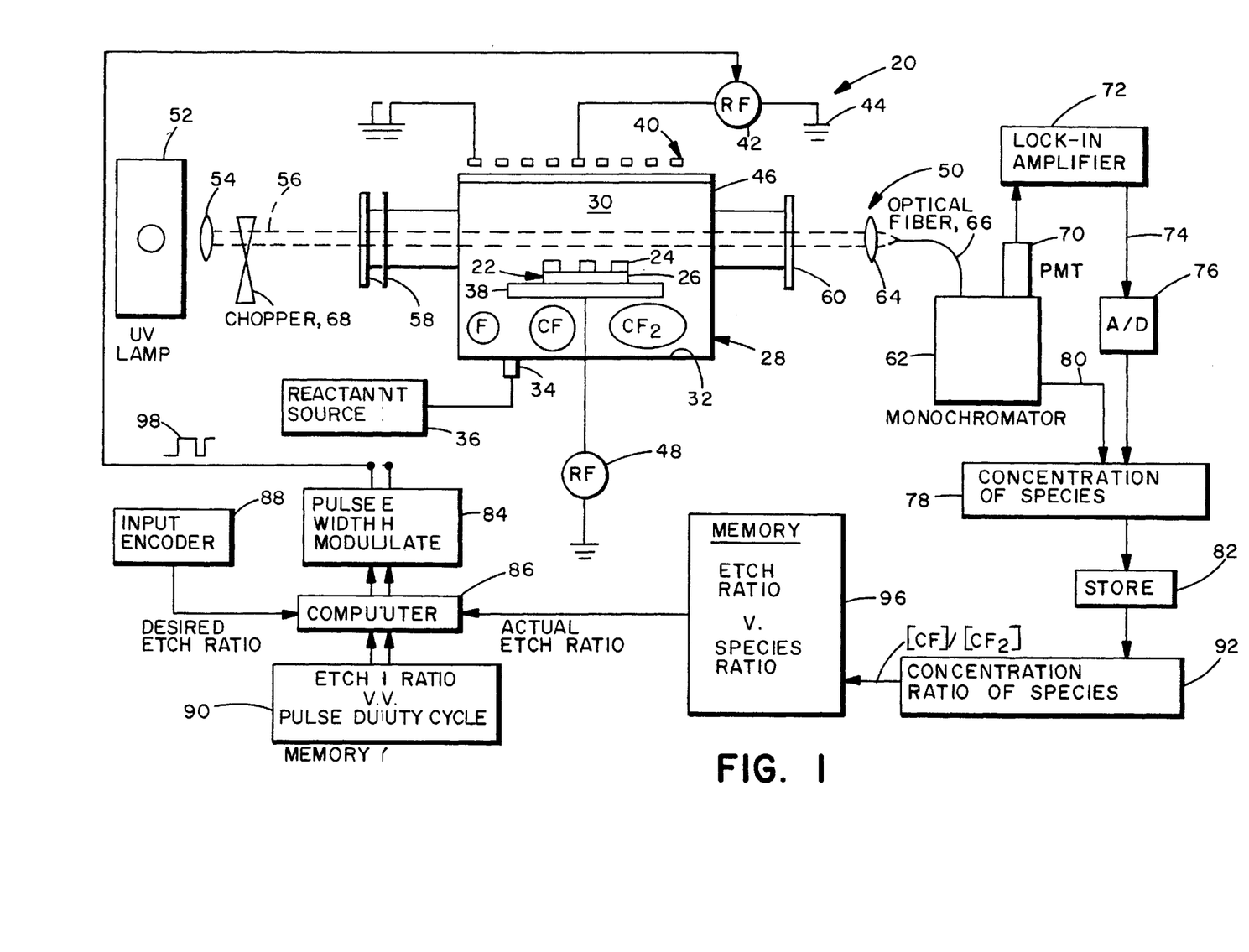
FIG. 1 shows a diagrammatic view of an etching system constructed in accordance with the invention.

FIG. 1 shows a system 20 for selectively etching materials of a workpiece 22, in accordance with the invention. By way of example, the workpiece 22 is a semiconductor wafer having plural layers of materials such as a layer 24 of silicon dioxide disposed on a substrate 26 of silicon. In the fabrication of a semiconductor device, from the workpiece 22, various amounts of material are to be removed from the silicon dioxide layer 24, and the silicon substrate 26. The removal of the material is accomplished by selectively etching the layer 24 and the substrate 26 for independent control of the amount of material to be removed from the layer 24 and the substrate 26. The etching is accomplished in a reactor 28 which provides an environment of plasma 30 having plural reactants which selectively etch the respective materials of the workpiece 22.

Various etchants are available for the etching of silicon dioxide and silicon. By way of example in the practice of the invention, the plasma comprises ions and neutral fluorocarbon species such as CF and $CF_2$ which selectively etch the silicon dioxide relative to silicon through a reaction mechanism which involves the selective formation of polymer films on the silicon substrate. The plasma 30 is formed by evacuating the reactor chamber 32, followed by a charging of the chamber 32 with a gas via a port 34 from a supply 36 of reactants. The gas includes component gases such as $CF_4$ or $C_2F_6$ by way of example. A typical range of pressure of the gas in the chamber 32 is 1–100 millitorr. The workpiece 22 is supported on an electrically conductive plate 38 within the chamber 32.

An inductor, the turns of which are indicated schematically at 40, is energized by a source 42 of RF current to provide an RF electromagnetic field within the chamber 32 of sufficient intensity to generate the plasma. The RF source 42 is connected between the inductor 40 and ground 44, and operates at a frequency 13.56 Mhz (megahertz). The inductor 40 is located outside a window 46 of the chamber 32, the window 44 being made of a material, such as quartz, which is transparent to the RF field. The plate 38 serves as an electrode, and is connected to a source 48 of RF power, the source 48 being connected between ground and the plate 38 for applying the RF power to the plate 38 to provide a self-bias voltage.

The system 20 further comprises a sensor 50 of the concentrations of gaseous species, such as the CF and the $CF_2$ radicals, within the chamber 32. In a preferred embodiment of the invention, the sensor 50 is operative by ultraviolet (UV) absorption spectroscopy, and comprises a UV lamp 52 outputting UV radiation via a lens 54 which forms a beam 56 of the UV radiation. The beam 56 is directed through the chamber 32 via viewing ports 58 and 60, and is received by a monochromator 62 with the aid of a lens 64 which focuses the radiation upon an optical fiber 66, the fiber 66 conducting the radiation to the monochromator 62. The beam 56 of radiation is chopped by a chopper 68 to provide pulses of radiation to be received at the monochromator 62 within a relatively narrow bandwidth about the chopping frequency for improved signal-to-noise ratio during reception of the radiation.

The monochromator 62 determines the frequency of a narrow region of the electromagnetic spectrum being examined, and outputs the optical energy of the spectral region via a photomultiplier tube (PMT) 70 and a lock-in amplifier 72 to provide an analog signal at line 74 which represents the intensity of the optical signal within the narrow spectral region under observation. Optical energy at various portions of the spectrum is absorbed by radicals in the chamber 32, the spectral lines wherein the peak absorptions occur serving as signatures to identify the various radicals. The signal at line 74 is converted from analog to digital format by converter 76 and is applied to a computer 78 which analyzes the spectral waveform to determine the concentrations of the respective species within the chamber 32. Identification of the spectral frequency, corresponding to each value of spectral amplitude on line 74, is outputted by the monochromator 62 via line 80 to the computer 78. The resulting concentrations of the various species of radicals in the chamber 32, as determined by the computer 78, are then stored at 82.

In accordance with the invention, the system 20 also comprises equipment for modulating the RF field in the reactor chamber 32 with a pulse width modulation which is varied automatically to maintain a desired selective etching of the materials of the workpiece 22 by the various species in the plasma 30. This equipment includes a pulse width modulator 84, a computer 86 for operating the modulator 84, an input encoder 88 for inputting to the computer 86 a desired etch ratio for the materials of the workpiece 22, a memory 90 storing a relationship between pulse duty cycle of the RF field and the resulting etch rate, a computer 92 operative to compute a ratio of the concentration of two species of ionized radicals, and a memory 96 providing predicted etch ratio based on the species concentration ratio from the computer 92 the gas pressure from the sensor 94. The three computers 78, 86 and 92 are presented to facilitate the description of the invention, it being understood that the functions of these computers can be accomplished by a single computer (not shown).

In operation, various species of radicals, such as F, CF and $CF_2$ are present in the chamber 32, as indicated in FIG. 1. Of particular interest in the selective etching of the silicon dioxide relative to silicon materials of the workpiece 22 are concentrations of the radicals CF and $CF_2$. The computer 92 extracts these concentrations from the store 82, and calculates the ratio of the CF concentration to the $CF_2$ concentration. From prior empirical observations, the ratio of the etch rate of the silicon dioxide to the etch rate of the silicon has been determined be a function of the concentration ratio $CF/CF_2$. This functional relationship is stored in the memory 96, and is outputted by the memory 96 to the computer 86 upon an addressing of the memory 96 by the computer 92.

The modulator 84 applies a gate signal, illustrated in stylized form at 98, to the RF source 42 to gate the output signal on and off for a pulse width modulation of the RF field in the chamber 32. Ions and neutral fragments of the plasma 30, including CF and the $CF_2$, are produced by the RF field during the portions of the modulation waveform wherein the RF field is energized. The concentrations of these species decrease during the portions of the modulation waveform wherein the RF field is deenergized. Since the decay rates for CF and the $CF_2$ differ, their resultant average concentrations, as well as the ratios of the averaged concentrations, vary as a function of the modulation duty cycle. Furthermore, since the relative etch rates of the materials of the workpiece depend on the $CF/CF_2$ concentration ratio, the etch ratio is also dependent on the modulation duty cycle and, in accordance with the invention, can be controlled by the modulation duty cycle.

From prior empirical observations, the relationship between pulse duty cycle and the relative etch rates of the silicon dioxide and the silicon has been determined, and is stored in the memory 90. In the operation of the computer 86 to command the modulator 84 to provide a specific value of pulse duty cycle, the desired etch ratio and the actual etch ratio are inputted to the computer 86 respectively by the encoder 88 and the memory 96. If there is a difference between the desired and the actual etch ratios, the computer 86 then directs an increase or a decrease in the pulse duty cycle, in accordance with the stored relationship in the memory 90, to bring the actual etch rate into agreement with the desired etch rate.

With respect to alternative embodiments of the invention, It is to be understood that the storing of the relationship of the relative etch rates of the silicon dioxide and the silicon in the memories 90 and 96 are presented by way of example in the description of the invention, and that the relative etch rates of other materials may also be stored in the memories 90 and 96 to allow the invention to be employed in the etching of such other materials. Also, the monitoring of the concentrations of the CF and the $CF_2$ ions is provided by way of example, and that the actual etch ratio can be determined alternatively from observation of the relative amounts of $CF_2$ and atomic fluorine from OES actinometry or other chemical species which participate in the selective etching reaction. Furthermore, the description of the reactor 28 as being an inductively coupled reactor employing the inductor 40 to energize the RF field is presented by way of example.

Figure 2:
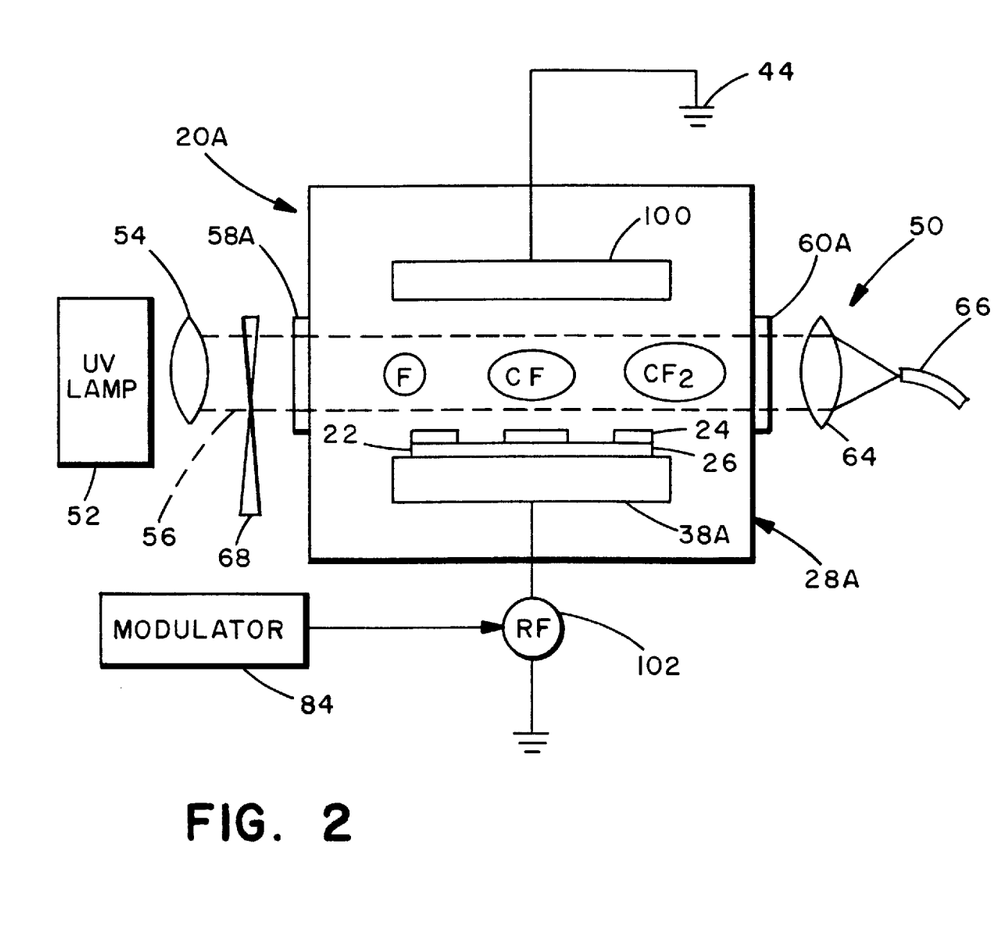
FIG. 2 shows a diagrammatic view of a portion of the system of FIG. 1 with a reactor thereof being constructed with an alternative embodiment.

An alternative reactor 28A may be constructed, as shown in a system 20A of FIG. 2, by use of an upper electrode plate 100 and a lower electrode plate 38A, wherein the RF field is established capacitively by application of an RF potential, typically in the range of a few hundred volts, between the plates 100 and 38A. The upper plate is grounded at 44, and an RF power source 102, operative in the frequency range of typically 13–40 Mhz, is connected between the lower electrode plate 38A and ground to establish the RF field between the plates 100 and 38A within the region of the plasma. Sensing of plasma constituents is accomplished in the same fashion as disclosed in FIG. 1 whereby, in FIG. 2, the beam 56 of ultraviolet radiation propagates via viewing ports 58A and 60A of the reactor 28A for operation of the sensor 50. Modulation of the RF field is accomplished by connection of the modulator 84 to the RF source 102 for gating the source 102 to pulse the RF field in the reactor 28A. The workpiece 22 rests on the plate 38A.

By way of example in the use of the reactor 28 with the system 20 of FIG. 1, the etching of the silicon dioxide and the silicon is accomplished in an RF induction plasma operating with $C_2H_2F_4$/CF4/Ar (flow ratio of 4:4:20 sccm) at a pressure of 40 millitorr and an RF power of 300 watts applied to the inductor (40). The RF power applied to the plate 38 produces a self bias voltage of –40 volts. The plasma is modulated with a square waveform applied to the inductor (40) at a frequency of 500 Hertz. The duty cycle of the modulating waveform is adjusted to allow the plasma to be energized for a time between 95 percent and 20 percent of the modulation period. A reduction in the duty cycle from 95 percent to 20 percent reduces the etch rate of both the silicon dioxide and the silicon because of reduced power of deposition of the etchants, but the etch rate ratio of $SiO_2$/Si increases by 51 percent.

Figure 3:
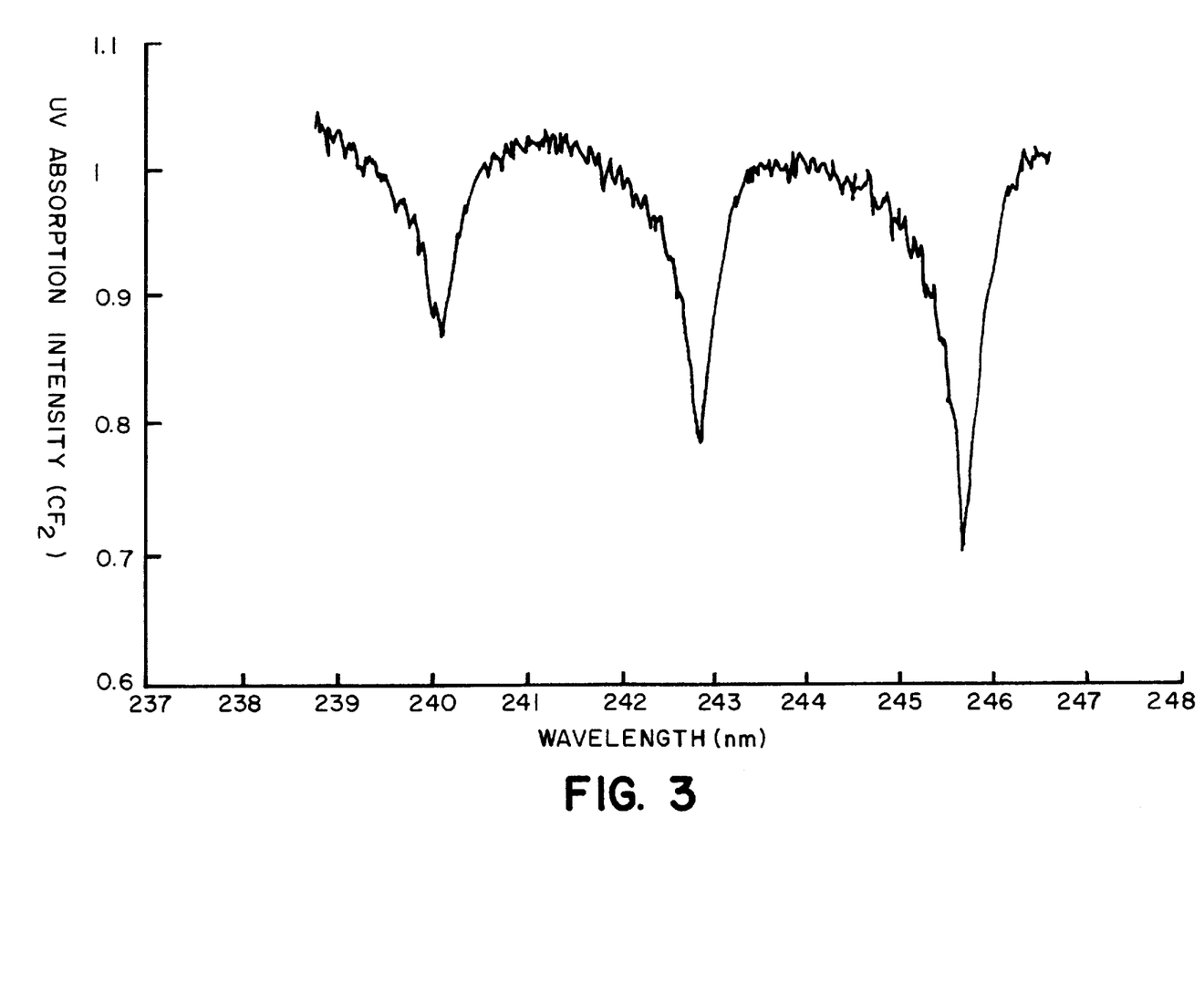
FIG. 3 is a graph showing the UV absorption spectrum for $CF_2$.
Figure 4:
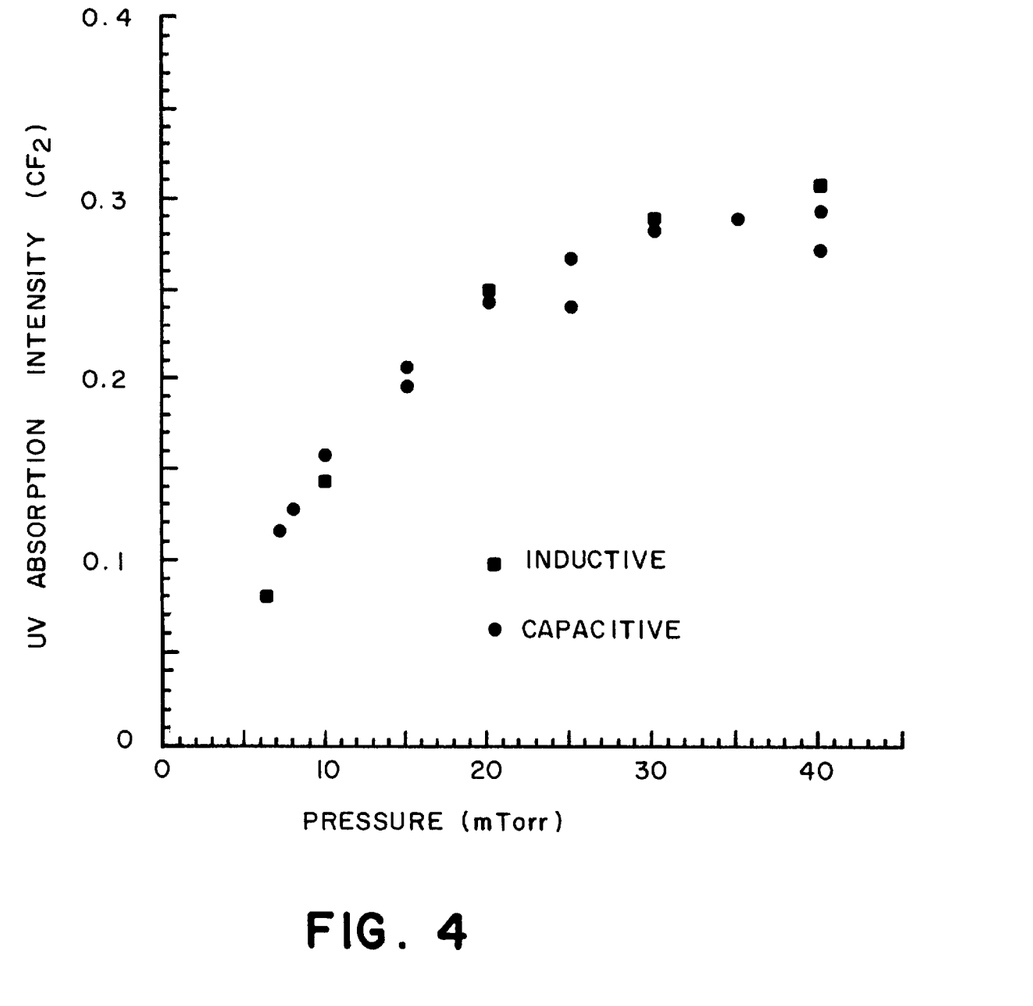
FIG. 4 is a graph showing variation of absorption intensity for $CF_2$ at a single wavelength as a function of gas pressure within a reactor chamber of FIGS. 1 and 2.
Figure 5:
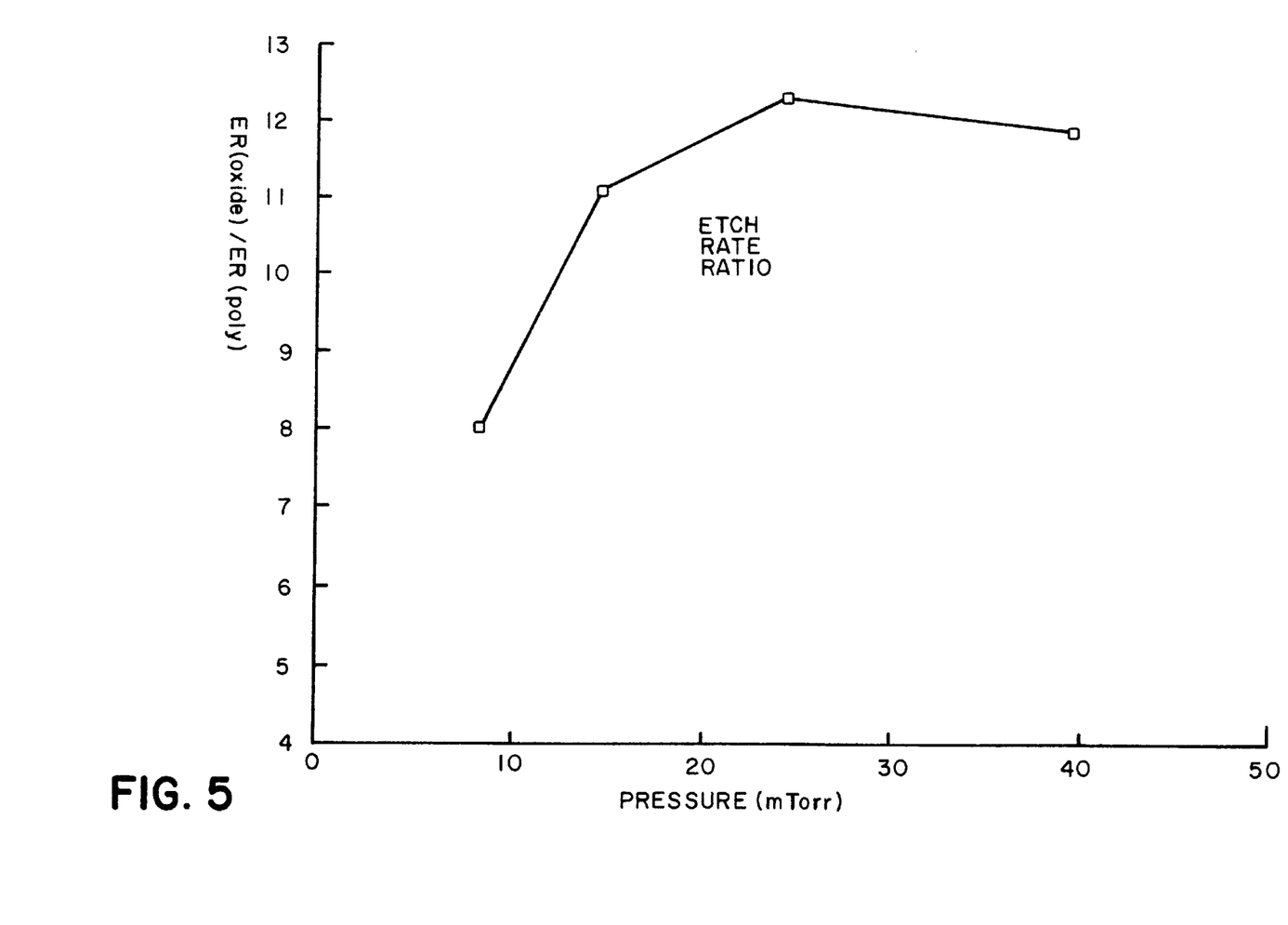
FIG. 5 is a graph presenting the ratio of the etch rates of silicon dioxide to polysilicon as a function of gas pressure.

Operation of the system 20 and 20A is explained further by reference to the graphs of FIGS. 3–9. FIG. 3 shows the UV absorption spectrum for $CF_2$ wherein intensity is shown on the vertical axis, and wavelength of the radiation in nanometers is shown on the horizontal axis. Dips in the intensity are due to absorption of optical energy by the $CF_2$ radicals at the wavelengths of the dips. FIG. 4 shows variation of UV absorption intensity for $CF_2$, on the vertical axis, at a single wavelength as a function of gas pressure within the reactor chamber, the gas pressure being presented on the horizontal axis in millitorr. The results are approximately the same for the inductive excitation of the reactor 28 and the capacitive excitation of the reactor 28A. FIG. 5 presents the ratio of the etch rates of the silicon dioxide to the polysilicon, shown on the vertical axis, as a function of the gas pressure, presented in millitorr on the horizontal axis. The behavior etch rate ratio (ERR) as a function of changing pressure closely follows that of the concentration of $CF_2$ in the plasma as determined by the UV absorption technique.

Figure 6:
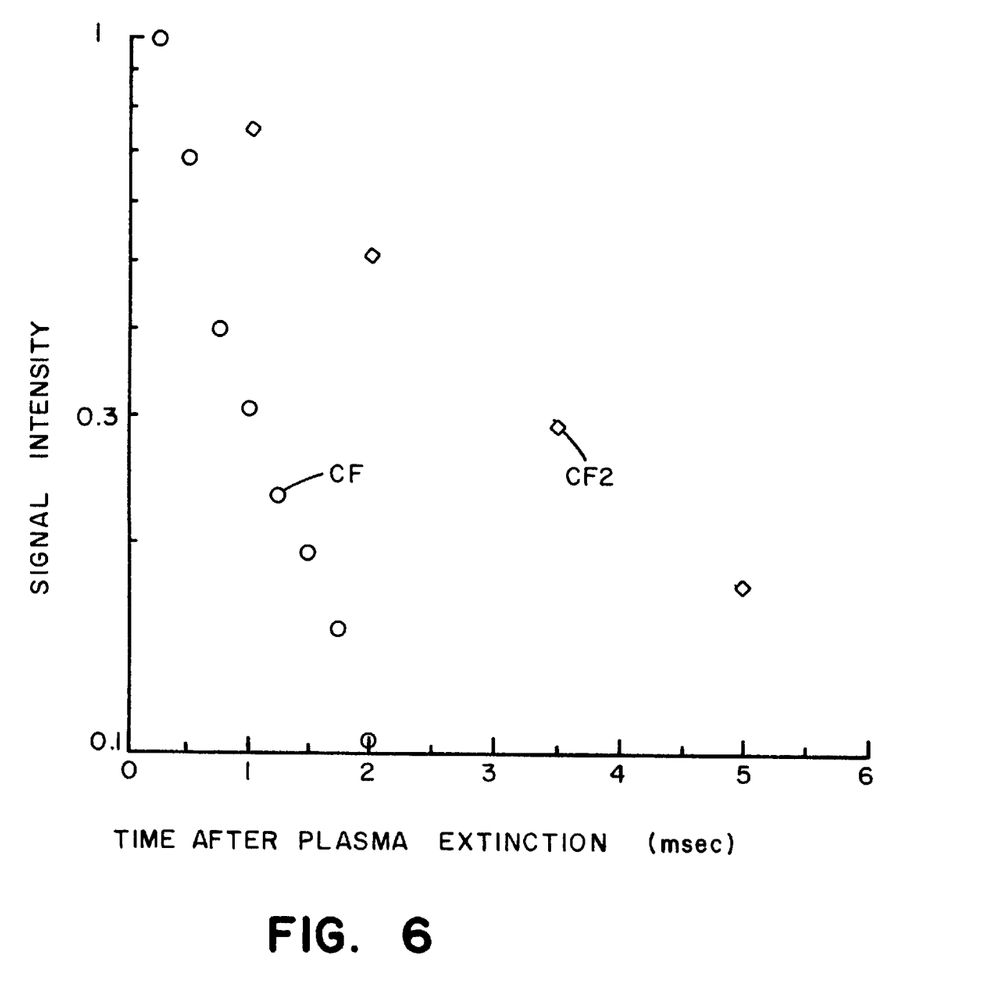
FIG. 6 is a graph showing spectrographic measurements of the concentrations of CF and $CF_2$ wherein increased signal intensity represents a higher concentration.

FIG. 6 shows spectrographic measurements of the concentrations of CF and $CF_2$ wherein increased signal intensity, shown on the vertical axis, represents a higher concentration. The measurements are made as a function of time after extinction of the RF field which excites the plasma, RF induction having been used for exciting the field as described for the reactor 28 of FIG. 1. This is shown in milliseconds on the horizontal axis. The graphs of FIG. 6 show that the $CF_2$ has a significantly longer lifetime than the lifetime of CF. The modulation of the RF field, in the practice of the invention, takes advantage of the feature of the different lifetimes to alter the average concentrations of these radicals as is exemplified by the following experimental data. At a modulation frequency of 500 Hz, and at a duty cycle of 95 percent, the concentration ration $CF/CF_2$ is 1.95, and the ERR (SiO2:Si) is 1.5. At a modulation frequency of 500 Hz, and at a duty cycle of 20 percent, the concentration ration $CF/CF_2$ is 0.67, and the ERR (SiO2:Si) is 2.4.

Figure 7:
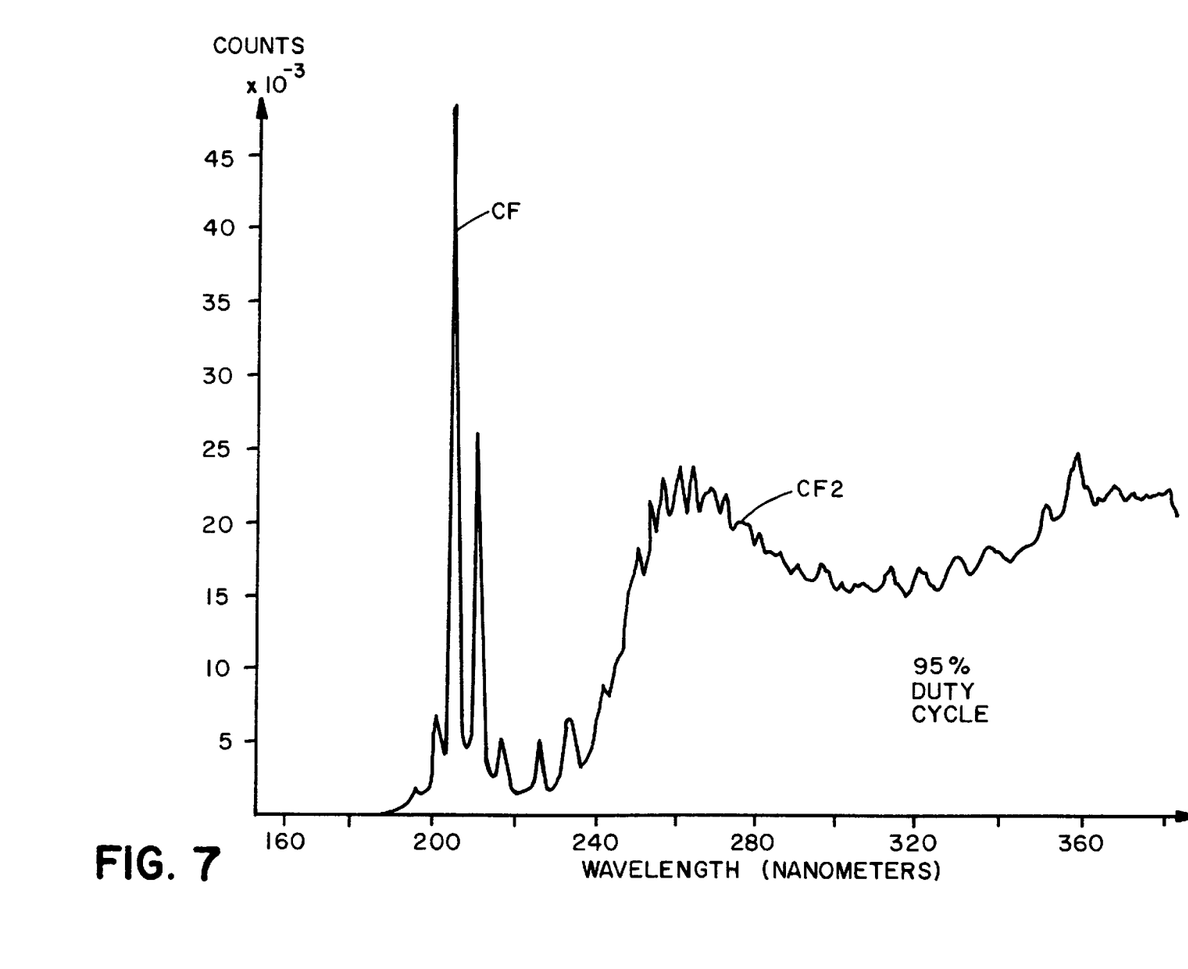
FIGS. 7 and 8 show spectrographic measurements of optical emission spectra of CF and $CF_2$ to indicate the relative amounts of CF and $CF_2$ for modulation duty cycles of 95 percent and 20 percent.
Figure 8:
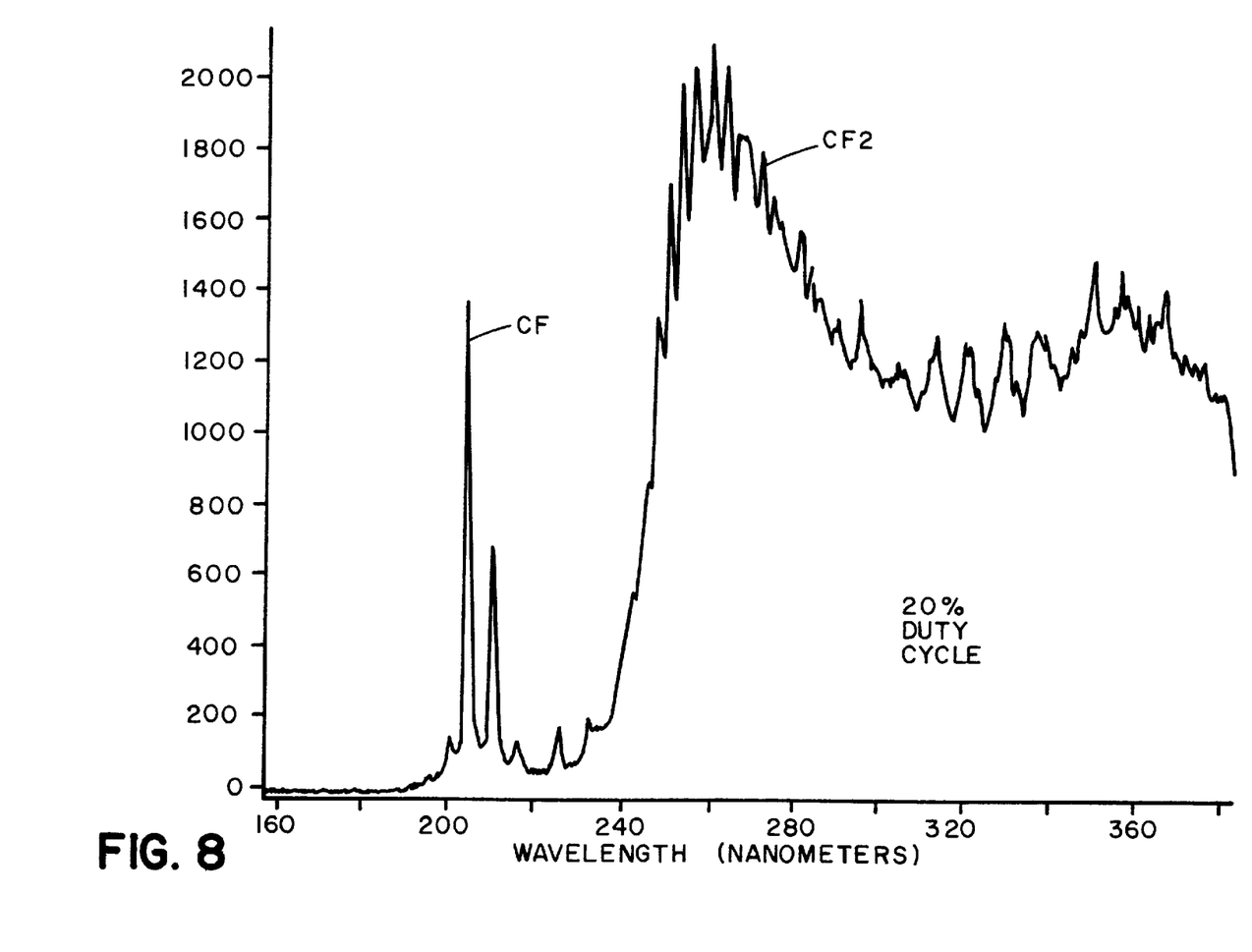

FIGS. 7 and 8 show spectrographic measurements of emission spectra of CF and $CF_2$ to approximate the relative amounts of CF and $CF_2$ wherein increased signal intensities, shown on the vertical axis, correlate with higher concentrations as confirmed by the UV absorption technique. The measurements are made as a function of wavelength, shown in nanometers on the horizontal axis, and for a modulation frequency of 500 Hz. For the case of a duty cycle wherein the RF field is excited for 95 percent of the modulation period, as depicted in FIG. 7, the highest intensity spectral line is shown for CF. For the case of a duty cycle wherein the RF field is excited for 20 percent of the modulation period, as depicted in FIG. 8, the highest intensity spectral line is shown for the $CF_2$.

Figure 9:
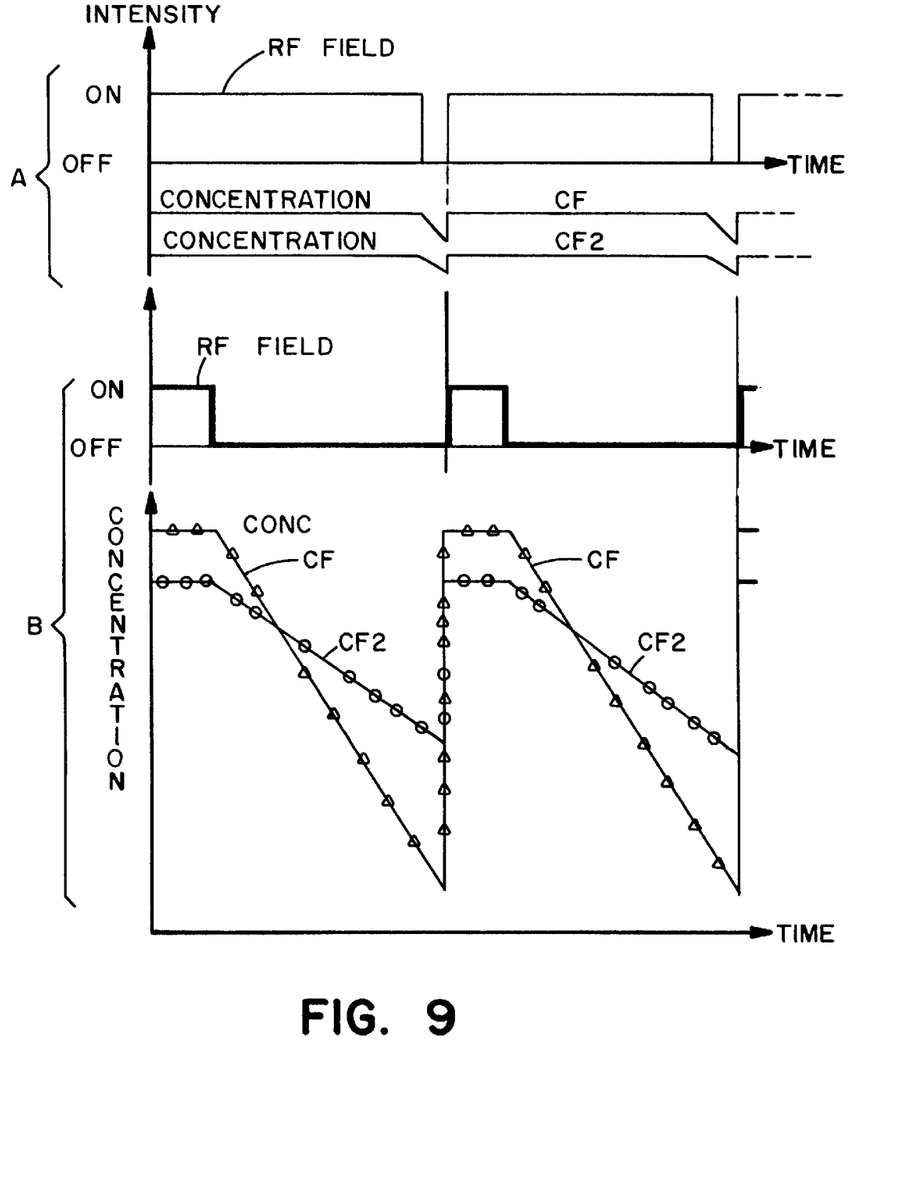
FIG. 9 is a graph having a set of traces demonstrating how the concentration of CF and $CF_2$ varies as a function of duty cycle.

FIG. 9 is not drawn to scale, but shows in stylized qualitative fashion how the concentration of CF and $CF_2$ varies as a function of duty cycle. The concentration of the CF decays faster than that of the $CF_2$. The upper traces of the graph, identified as group A, depict the concentrations of CF and $CF_2$ as a function of time for the situation wherein the RF field is modulated with a 95 percent activation and a 5 percent deactivation. The lower traces of the graph, identified as group B, depict the concentrations of CF and $CF_2$ as a function of time for the situation wherein the RF field is modulated with a 20 percent activation and an 80 percent deactivation. Thus a longer interval of deactivation of the RF field decreases the average concentration of the CF relative to that of the $CF_2$ with a corresponding change in the relative rates of etching of the silicon dioxide and the polysilicon.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A method for selectively etching a plurality of materials of a workpiece comprising steps of:
    enveloping the workpiece with a plasma having first and second species of a reactant which are operative to etch said plurality of materials, said plasma being provided by interacting an RF electromagnetic field with said first and said second species;
    modulating said field by pulse-width modulation to provide a sequence of field energization intervals interspersed among intervals of field deenergization, said first and said second species of reactant being characterized respectively by first and second rates of decay during one of said deenergization intervals, said first rate of decay being different from said second rate of decay resulting in an etchant concentration ratio of average values of concentrations of said first and said second species of reactant which varies in dependency on a duration of said one deenergization interval, and wherein an etching of said materials results in an etch selectivity ratio of a first etching rate of a first of said materials relative to a second etching rate of a second of said materials, the etch selectivity ratio depending on said etchant concentration ratio and on the duration of said one deenergization interval;
    measuring concentrations of said first and said second species of said reactant in said plasma for providing said etchant concentration ratio;
    based on said etchant concentration ratio, determining said etch selectivity ratio; and
    wherein, in said modulating step, the durations of said deenergization intervals are adjusted to obtain a desired value of the etch selectivity ratio.

2. A method according to claim 1 wherein said measuring step is accomplished by use of ultraviolet absorption spectroscopy.

3. A method according to claim 2 wherein said measuring includes generating a beam of ultraviolet radiation, pulsing or chopping said beam, directing said beam through said plasma, and detecting said beam upon a propagation of said beam through said plasma.

4. A method according to claim 1 wherein said determining step includes storing etching rates of said first and said second materials as a function of said etchant concentration ratio for the outputting of said etch selectivity ratio.

5. A method according to claim 1 wherein said modulating is accomplished by repetitively energizing and deenergizing said electromagnetic field, and said determining step includes calculating said etchant concentration ratio in response to measurements of concentrations of said first and said second species of reactant, and said modulating step is accomplished in response to a value of the etchant concentration ratio outputted by said determining step to obtain a desired selective etching of said plurality of materials.

* * * * *